United States Patent [19]
Conn

[11] Patent Number: 5,852,323
[45] Date of Patent: Dec. 22, 1998

[54] ELECTRICALLY PROGRAMMABLE ANTIFUSE USING METAL PENETRATION OF A P-N JUNCTION

[75] Inventor: Robert O. Conn, Los Gatos, Calif.

[73] Assignee: Xilinx, Inc., San Jose, Calif.

[21] Appl. No.: 784,226

[22] Filed: Jan. 16, 1997

[51] Int. Cl.$^6$ .................................................. H01L 29/00
[52] U.S. Cl. ..................... 257/530; 257/653; 257/775
[58] Field of Search .................................. 257/529, 530, 257/653, 775

[56] References Cited

U.S. PATENT DOCUMENTS

| | | | |
|---|---|---|---|
| 3,641,516 | 2/1972 | Castrucci et al. | 257/529 |
| 4,412,308 | 10/1983 | Bergeron | 257/529 |
| 4,683,442 | 7/1987 | Vyne | 330/261 |
| 5,298,784 | 3/1994 | Gambino et al. | 257/529 |

OTHER PUBLICATIONS

Fu, Kuan–Yu and Pyle, Ronald E., "On the Failure Mechanisms of Titanium Nitride/Titanium Silicide Barrier Contacts under High Stress," Dec. 1988, IEEE Transactions on Electron Devices, vol. 35, No. 12, pp. 2151–2159.

Hsieh, C. M. and Wilson, H. R., "Electrically Programmable Transistor Pipes," Dec. 1981, IBM Technical Disclosure Bulletin, vol. 24, No. 7A, pp. 3478–3479.

Pucknell, Douglas A. and Eshraghian, Kamran, "Basic VLSI Design," 1994, Prentice Hall Australia, Chapter 1, *A review of microelectronics and an introduction to MOS technology*, pp. 15–19.

*Primary Examiner*—J. Carroll
*Attorney, Agent, or Firm*—Arthur J. Behiel; Jeanette S. Harms

[57] ABSTRACT

An antifuse is described that can be formed without masks or mask steps beyond those required for a conventional CMOS process. The antifuse includes adjacent p-type and n-type diffusion regions that together form a P-N junction. The diffusion regions are tapered toward one another such that the P-N junction is located at a necked-down region of the antifuse. The diffusion regions are connected to respective terminals of a programming-voltage source via first and second metal electrical contacts, typically of aluminum metal. Each of the first and second electrical contacts includes a point directed toward the other of the first and second electrical contacts. The antifuse is programmed by providing a reverse-bias programming voltage across the electrical contacts. This programming voltage exceeds the breakdown voltage of the P-N junction so that current flows through the necked-down region of the antifuse between the points on the respective first and second electrical contacts. This current heats the region between the opposite points to create a hot filament between the first and second metal contacts. Metal from the metal contacts then diffuses along the filament to form a conductor between metal contacts.

15 Claims, 2 Drawing Sheets

5,852,323

ELECTRICALLY PROGRAMMABLE ANTIFUSE USING METAL PENETRATION OF A P-N JUNCTION

BACKGROUND OF THE INVENTION

1. Field of the Invention

The present invention relates to integrated circuit (IC) structures and, in particular, to antifuses.

2. Related Art

Antifuses are IC structures that can be permanently programmed from a state of high impedance (an open circuit) to a state of relatively low impedance (a short circuit). Such devices are conventionally used to implement programmable read-only memories (PROMs), programmable logic devices (PLDs), and field-programmable gate arrays (FPGAs).

Many conventional antifuses are available. For example, FIG. 1A shows a vertical, two-terminal antifuse 100 of the type used in the ACT™ family of FPGAs available from Actel Corporation of Sunnyvale, Calif. Antifuse 100 includes a polysilicon top layer (Poly-Si), an oxide-nitride-oxide (ONO) dielectric layer, and an n+ doped silicon bottom layer.

Antifuse 100 is programmed by placing a relatively high voltage (e.g., 18 volts) across the antifuse. This causes the dielectric layer ONO to melt and form a conductive link between the polysilicon top layer and the n+ bottom layer.

FIG. 1B shows a second vertical, two-terminal antifuse 150. Antifuse 150 is similar to the ViaLink™ antifuse used by QuickLogic Corporation of Santa Clara, Calif. Antifuse 150 includes a metal top layer (metal A), a layer of amorphous silicon, and a second level of metal (metal B) as a bottom layer. Antifuse 150 is programmed approximately 10 volts across its terminals (not shown), thereby creating a conductive link between metal layers A and B.

Unfortunately, both of antifuses 100 and 150 require additional masks, typically three, beyond what is necessary to implement a conventional CMOS IC fabrication process. These additional masks and associated processes increase the cost of creating a CMOS device that includes antifuses. Therefore, a need exists for an antifuse that can be created using a CMOS process without requiring additional masks or mask steps.

SUMMARY

The present invention is directed to an antifuse that can be formed without masks or mask steps beyond those required for a conventional CMOS process. An antifuse in accordance with one embodiment of the invention includes adjacent p-type and n-type diffusion regions that together form a P-N junction. Each of the diffusion regions is tapered toward the other such that the P-N junction is located in a necked-down region of the antifuse.

The diffusion regions are connected to respective terminals of a programming-voltage source via first and second metal (typically aluminum) electrical contacts. Each of the first and second electrical contacts includes a point directed toward the other of the first and second electrical contacts. The distance between the points is the minimum distance between the first and second electrical contacts.

In an unprogrammed state, the reverse-bias resistance of the antifuse is in the tens of megohms. The antifuse can be programmed by providing a reverse-bias programming voltage of approximately 10 volts across the electrical contacts. This programming voltage exceeds the breakdown voltage of the P-N junction. As a consequence, current flows through the necked-down region of the antifuse between the points on the respective first and second electrical contacts. This current heats the region between the opposite points to create a hot filament between the first and second metal contacts. Metal from the metal contacts then diffuses along the filament to form a conductor between metal contacts. The presence of the conductor decreases the resistance between the metal contacts by several orders of magnitude.

BRIEF DESCRIPTION OF THE FIGURES

Features, aspects, and advantages of the present invention will become better understood with regard to the following description, appended claims, and accompanying figures, where:

DETAILED DESCRIPTION

1. The Antifuse Structure

Figure 1A:
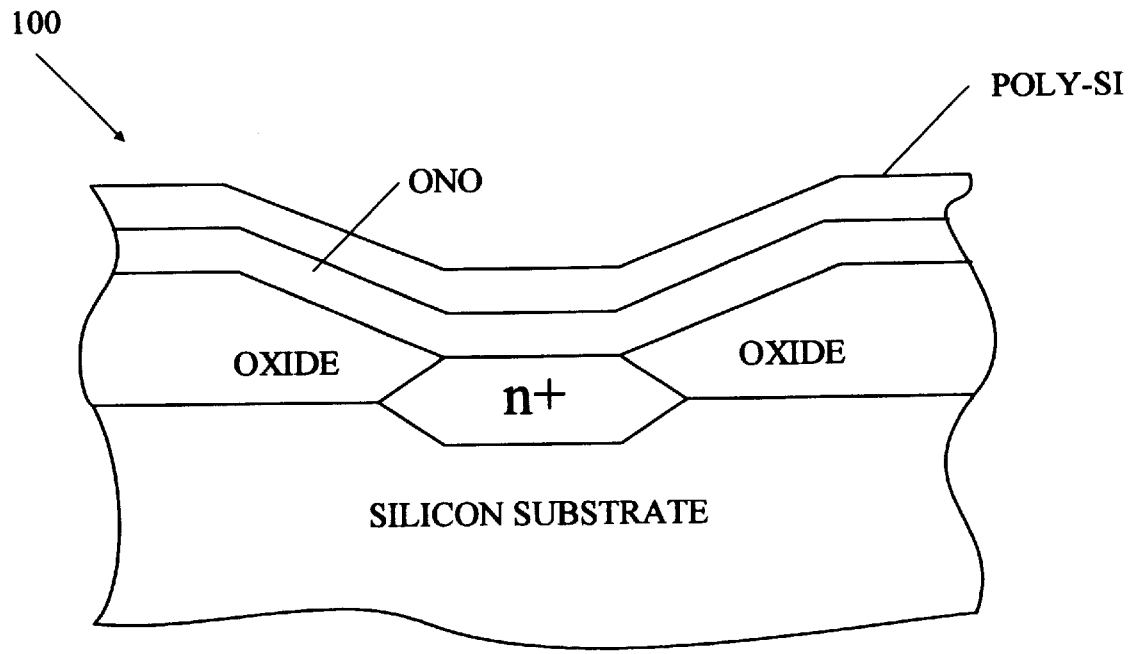
FIG. 1A shows a vertical, two-terminal antifuse 100.
Figure 1B:
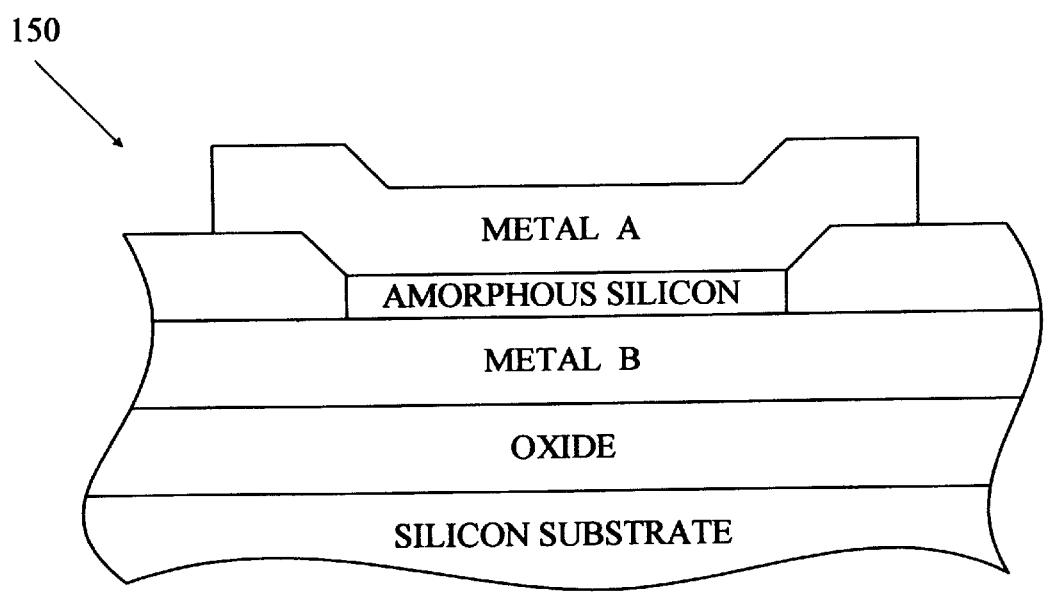
FIG. 1B shows a second vertical, two-terminal antifuse 150.
Figure 2A:
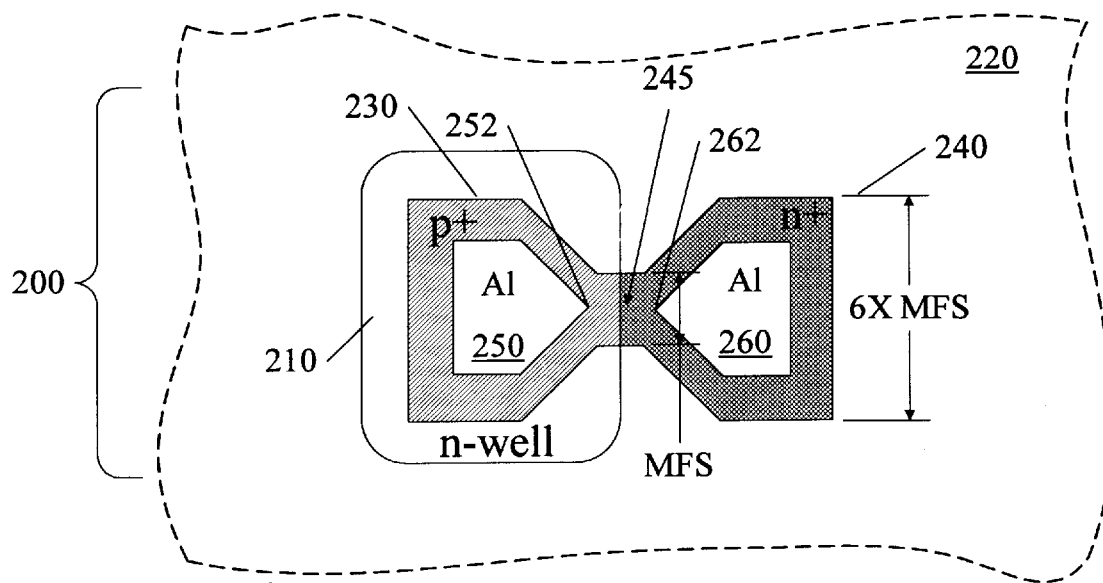
FIG. 2A is a top-view of an antifuse 200 in accordance with the present invention.
Figure 2B:
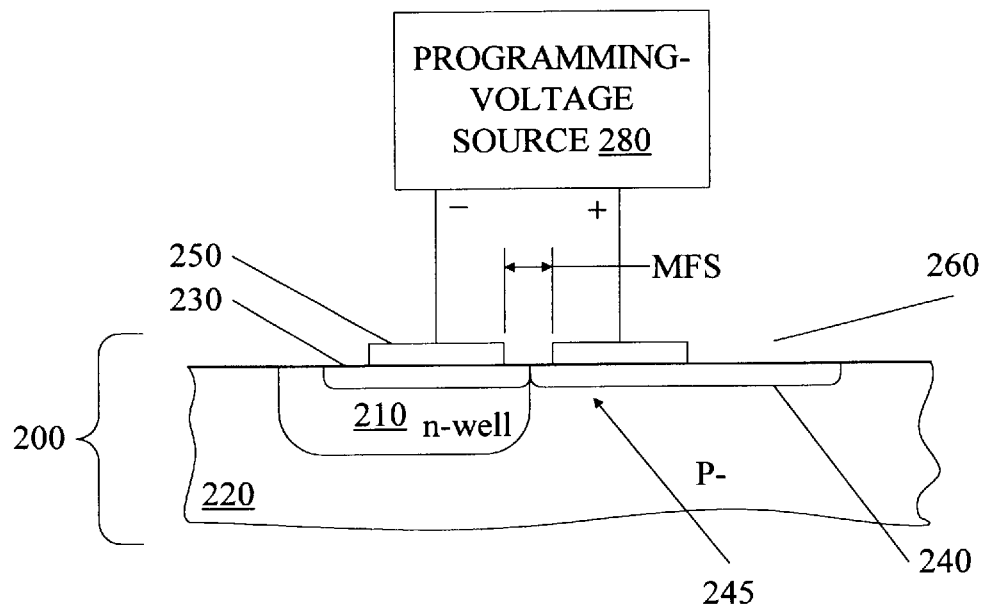
FIG. 2B is a cross-sectional view of antifuse 200 connected to a programming-voltage source 280.

FIG. 2A depicts a top-view of an antifuse 200 in accordance with the present invention. Antifuse 200 includes an n-well 210 formed within a p-doped epitaxial epitaxial layer 220. A p+ region 230 and an n+ region 240 join at a relatively narrow necked-down region 245 to form a P-N junction diode. In the present example, the diode is an avalanche diode; however, other types of diodes may be used. Aluminum metal contacts 250 and 260 on respective regions 230 and 240 provide electrical contacts to the diode.

The width of necked-down region 245 is typically 0.5 microns or less, depending on the minimum diffusion width of the process employed to create regions 230 and 240. As explained below, minimizing the width of necked-down region 245 helps in programming antifuse 200 by encouraging the formation of a filament between metal contacts 250 and 260.

The ends of regions 230 and 240 are typically from 2 to 4 microns. The areas of metal contacts 250 and 260 are typically four times that of other contacts (not shown) on epitaxial layer 240 (e.g., twice as wide and twice as long). Consequently, metal contacts 250 and 260 contain approximately four times as much metal as those other contacts. Providing additional metal for metal contacts 250 and 260 improves the antifuse properties of antifuse 200 by ensuring ample metal is available to diffuse along the filament to form a conductor.

Metal contacts 250 and 260 include respective points 252 and 262. The points 252 and 262 are directed toward one another and are typically separated by the minimum feature size (MFS) of the process used to create antifuse 200. In one embodiment, the minimum feature size is less than one-half micron.

2. Programming the Antifuse

In an unprogrammed state, the reverse-bias resistance of antifuse 200 is in the tens of megohms. To program antifuse 200, a reverse-bias programming voltage of approximately six to ten volts is applied across the P-N junction at necked-down region 245 via metal contacts 250 and 260. The programming voltage exceeds the breakdown voltage of antifuse 200 so that the current, in one embodiment approximately 10 to 20 milliamps, flows through necked-down region 245 from metal contact 250 to metal contact 260. This current and the resistance of antifuse 200 heat the region between metal contacts 250 and 260 to create a filament between the opposite points 252 and 262. Aluminum metal from metal contacts 250 and 260 then migrates (diffuses) along the hot filament to form an alloy conductor between metal contacts 250 and 260. Metal contacts 250 and 260 are preferably larger than conventional contacts typically used in CMOS processes to ensure that there is sufficient metal available for conductor formation.

Points 252 and 262 define between them a path of least electrical resistance, which advantageously concentrates the current between metal contacts 250 and 260 to aid in forming the filament along which the metal diffuses. The shapes of points 252 and 262 are not limited to those shown, and need not be "pointed." For example, the points may be points on respective curved contact surfaces. Whatever their form, points 252 and 262 should define between them a narrow region of increased electric-field strength.

The formation of a conductor between points 252 and 262 is encouraged by minimizing the cross-sectional area of necked-down region 245. Such minimization increases the impedance between points 252 and 262, thereby decreasing the programming current required from programming-voltage source 280. Moreover, reducing the cross-sectional area of necked-down region 245 decreases the amount of metal required to create the conductor between metal contacts 250 and 260.

The programming voltage is removed after the low-impedance state is reached. There is no need for additional "programming," as once the conductor crosses the metallurgical junction, antifuse 200 never recovers; instead, the resistance of antifuse 200 typically decreases with normal usage. The conductor formed between metal contacts 250 and 260 by the programming current remains after the programming voltage is removed. The presence of this conductor permanently reduces the resistance between metal contacts 250 and 260, typically to tens of ohms.

3. Antifuse Fabrication

In one embodiment, antifuse 200 is formed using a conventional n-well CMOS process. However, antifuses in accordance with the present invention may also be formed using p-well processes, or with neither p- nor n-wells. For this reason, antifuse 200 may be formed along with other circuit features of a CMOS IC without complicating the CMOS fabrication sequence.

In a typical n-well fabrication sequence, a first mask defines n-well region 210. Next, a low dose of an n-type dopant, such as phosphorus, is driven in by a high-temperature diffusion. The depth of n-well region 210 is preferably selected to be the same as other n-well regions of the IC so that the CMOS fabrication sequence need not be altered.

Next, a p+ mask is used to define the area of p+ region 230. The p+ mask is followed by a conventional p+ diffusion of boron, or other p-type dopant. An n+ mask is similarly used to define the area of n+ region 230, which is then exposed to an n+ diffusion of phosphorus or another n-type dopant. Finally, a layer of aluminum metal is conventionally patterned and etched to form metal contacts 250 and 260.

The aforementioned steps, except for the mask patterns, are all conventional. Other steps are also included in a conventional CMOS fabrication sequence. However, these steps are well known; a description of them has therefore been omitted for brevity. For a more detailed description of several conventional CMOS fabrication processes that may be used to form an antifuse in accordance with the present invention, see Douglas A. Pucknell and Kamran Eshraghian "Basic VLSI Design, Third Edition," pp. 15–19 (1994), which is incorporated herein by reference.

4. Conclusion

Although the present invention has been described with reference to certain preferred versions thereof, other versions are possible. For example, other metals that alloy with silicon may be used to form contacts 250 and 260. Also, antifuses in accordance with the present invention could be fabricated as vertical structures or horizontal structures, or could be fabricated using PMOS, NMOS, or bipolar processes. Hence, the scope of the appended claims is not limited to the description of the preferred versions contained herein.

What is claimed is:

1. An antifuse comprising:
   a first diffusion region of a first conductivity type formed in a semiconductor layer, the first diffusion region having a first width in a dimension parallel to the semiconductor layer;
   a second diffusion region of a second conductivity type formed in the semiconductor layer adjacent to the first diffusion region, the second diffusion region contacting the first diffusion region to form a P-N junction, the P-N junction having a second width in a dimension parallel to the semiconductor layer, wherein the second width is less than the first width;
   a first metal electrical contact formed on the first diffusion region; and
   a second metal electrical contact formed on the second diffusion region.

2. The antifuse of claim 1, wherein the first and second electrical contacts define between them a path of least electrical resistance perpendicular to the P-N junction.

3. The antifuse of claim 2, the first metal electrical contact comprising a point directed toward the second metal electrical contact.

4. The antifuse of claim 3, the second metal electrical contact comprising a second point directed toward the first-mentioned point, wherein the first and second points define between them the path of least electrical resistance.

5. An antifuse comprising:
   a first diffusion region of a first conductivity type formed in a semiconductor layer;
   a second diffusion region of a second conductivity type formed in the semiconductor layer adjacent the first diffusion region, the second diffusion region contacting the first diffusion region to form a P-N junction;
   a first metal electrical contact formed on the first diffusion region and including a point directed toward the second diffusion region, the point defining a minimum distance between the first metal electrode and the second diffusion region, whereby the minimum distance defines a path of least electrical resistance between the first metal electrical contact and the second diffusion region; and
   a second metal electrical contact formed on the second diffusion region.

6. The antifuse of claim 5, wherein one of the first and second diffusion regions is tapered toward the other of the first and second diffusion regions to form a necked-down region in which the P-N junction is located, wherein the necked-down region includes a minimum width in a dimension parallel to a surface of the semiconductor layer.

7. The antifuse of claim 5, wherein one of the first and second diffusion regions is tapered toward the other of the first and second diffusion regions to form a necked-down region in which the P-N junction is located, and wherein the necked-down region has a width defined by the minimum feature size of a process used to form the antifuse.

8. The antifuse of claim 7, wherein the minimum feature size is less than one micron.

9. The antifuse of claim 6, wherein the first and second diffusion regions are tapered toward one another in a dimension parallel to a surface of the semiconductor layer.

10. The antifuse of claim 5, the second metal electrical contact comprising a second point directed toward the first-mentioned point, wherein the first and second points define between them the path of least electrical resistance.

11. The antifuse of claim 10, further comprising a means for generating a programming voltage, the means having a first terminal connected to the first electrical contact and a second terminal connected to the second electrical contact.

12. The antifuse of claim 11, wherein the programming voltage, when applied across the first and second electrical contacts, creates a filament of diffused metal between the first and second electrical contacts.

13. The antifuse of claim 5, wherein the metal is aluminum.

14. The antifuse of claim 5, wherein the semiconductor layer is of a first conductivity type and includes a well of a second conductivity type, and wherein the first diffusion region is formed within the well.

15. An antifuse comprising:

a semiconductor layer of a first conductivity type, the layer including a well of a second conductivity type;

a first diffusion region of the first conductivity type formed within the well;

a second diffusion region of the second conductivity type formed within the layer and adjacent the first diffusion region, the second diffusion region contacting the first diffusion to form a P-N junction;

a first metal electrical contact formed on the first diffusion region and including a point directed toward the second diffusion region, the point defining a minimum distance between the first metal electrode and the second diffusion region, whereby the minimum distance defines a path of least electrical resistance between the first metal electrical contact and the second diffusion region;

a second metal electrical contact formed on the second diffusion region; and means for generating a programming voltage, the means having a first terminal connected to the first electrical contact and a second terminal connected to the second electrical contact, wherein the first metal electrical contact includes a point that extends toward the second metal electrical contact.

* * * * *